United States Patent [19]

Russell et al.

[11] Patent Number: 4,855,870
[45] Date of Patent: Aug. 8, 1989

[54] ASSEMBLIES FOR SUPPORTING ELECTRICAL CIRCUIT BOARDS WITHIN TUBES

[75] Inventors: Michael K. Russell, Prestbury, England; Donald L. Wesenberg, Santa Barbara, Calif.; Peter A. Leaney, Charlton Kings, England

[73] Assignee: NL Industries, Inc., Houston, Tex.

[21] Appl. No.: 98,286

[22] Filed: Sep. 18, 1987

Related U.S. Application Data

[63] Continuation-in-part of Ser. No. 854,367, Apr. 21, 1986, Pat. No. 4,694,555.

[30] Foreign Application Priority Data

Feb. 7, 1986 [GB] United Kingdom ............... 8603122

[51] Int. Cl.$^4$ ............................................. H05K 1/14
[52] U.S. Cl. ...................................... 361/395; 174/52.1
[58] Field of Search ............ 291/450; 174/52 R, 68.5; 361/386, 395, 399, 400, 414, 415, 403, 397, 412

[56] References Cited

U.S. PATENT DOCUMENTS

| | | | |
|---|---|---|---|
| 2,832,012 | 4/1958 | Kleason et al. ................. | 361/394 X |
| 2,976,806 | 3/1961 | Risk et al. ......................... | 361/394 |
| 3,083,259 | 3/1963 | Wells ................................ | 174/68.5 |
| 3,500,130 | 3/1970 | Aument et al. ..................... | 361/394 |
| 3,539,874 | 11/1970 | Swanson ..................... | 174/52 R X |
| 3,699,394 | 10/1972 | Schuler ......................... | 361/395 X |
| 3,833,836 | 9/1974 | Moksu et al. .................... | 361/412 X |
| 3,847,703 | 11/1974 | Kaiser ................................ | 29/451 X |
| 3,953,662 | 4/1976 | Nagashima et al. ............... | 174/52 R |
| 4,053,943 | 10/1977 | Galvin ............................... | 361/399 |
| 4,072,378 | 2/1978 | Lockbrunner et al. ........ | 361/399 X |
| 4,092,697 | 5/1978 | Spaight ............................ | 361/386 |
| 4,112,481 | 9/1978 | Roge et al. ......................... | 361/395 |
| 4,184,539 | 1/1980 | Rein ............................... | 361/386 X |
| 4,225,900 | 9/1980 | Ciccio et al. ....................... | 361/395 |
| 4,386,390 | 5/1983 | Hammond ......................... | 361/412 |
| 4,400,858 | 8/1983 | Goiffon et al. ................ | 361/386 X |
| 4,447,842 | 5/1984 | Berg ................................. | 361/386 |
| 4,521,829 | 6/1985 | Wessely ......................... | 361/386 X |
| 4,528,615 | 7/1985 | Perry ............................... | 361/386 |
| 4,536,710 | 8/1985 | Dunham ....................... | 361/400 X |
| 4,542,437 | 9/1985 | Ellis et al. ...................... | 361/395 X |
| 4,547,833 | 10/1985 | Sharp ............................ | 174/52 R X |
| 4,577,386 | 3/1986 | Faudou et al. .................... | 29/455 R |
| 4,602,125 | 7/1986 | West et al. ...................... | 361/403 X |
| 4,633,248 | 12/1986 | Small ............................. | 361/394 X |
| 4,668,873 | 5/1987 | Ohba et al. ..................... | 361/395 X |

FOREIGN PATENT DOCUMENTS

| | | |
|---|---|---|
| 940417 | 10/1963 | United Kingdom . |
| 964861 | 7/1964 | United Kingdom . |
| 1409717 | 10/1975 | United Kingdom . |

*Primary Examiner*—Charlie T. Moon
*Attorney, Agent, or Firm*—Browning, Bushman, Zamecki & Anderson

[57] ABSTRACT

The present invention is directed to an assembly for supporting an electrical circuit board within a tube. The assembly comprises a circuit board, an elongated support spine extending longitudinally along the tube and supporting the circuit board and a shock absorbing device for holding the assembly within the tube. The circuit board is disposed parallel to a support surface of the spine with a gap therebetween and a layer of a vibration absorbing material is disposed in the gap between the circuit board and the spine. The vibration absorbing material preferably is an elastomer. Most preferably, the vibration absorbing material comprises a layer of a thixotropic elastomer together with a layer of a silicon elastomer.

9 Claims, 1 Drawing Sheet

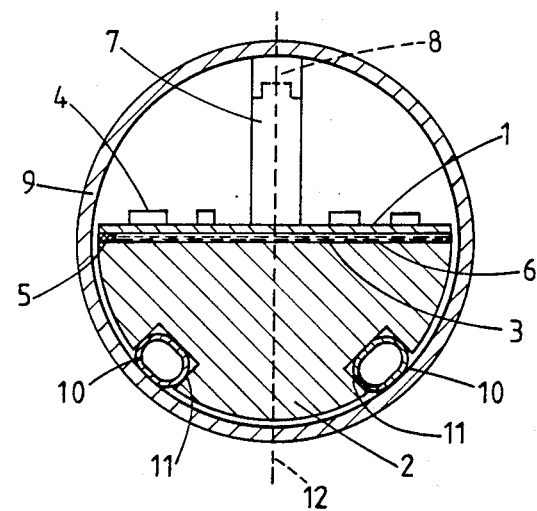
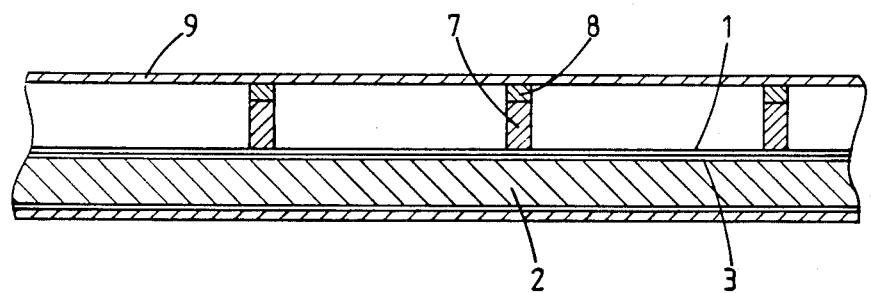
FIG. 1.
FIG. 2.

ASSEMBLIES FOR SUPPORTING ELECTRICAL CIRCUIT BOARDS WITHIN TUBES

CROSS REFERENCE

This application is a continuation-in-part application of co-pending U.S. Pat. application Ser. No. 854,367 filed Apr. 21, 1986, now U.S. Pat. No. 4,694,555.

BACKGROUND OF THE INVENTION

This invention relates to assemblies for supporting electrical circuit boards within tubes, and is concerned more particularly, but not exclusively, with assemblies for supporting circuit boards within measurement probes to be accommodated down-hole in a borehole such that the circuit boards are substantially resistant to mechanical vibration and shock.

In the surveying of boreholes various measurements are taken down-hole and are processed prior to being transmitted to the surface, for example by means of a mud-pulse signalling transmitter. The appropriate measuring instrumentation and processing circuitry is mounted within a drill collar incorporated in the drill string in the vicinity of the drill bit. More particularly the circuit boards accommodating the measurement and processing circuitry are suppored within an elongate tube which is in turn mounted within a sleeve by means of a pivotal coupling at one end to allow limited pivotal movement of the probe within the sleeve. The sleeve is then itself mounted within the drill collar with the interposition of a suitable damping medium between the outside of the sleeve and inside wall of the drill collar.

In operation of such instrumentation downhole, however, the circuit boards are subjected to very high levels of vibration and this can lead to the creation of strains at the junctions between the circuit components and the circuit boards which can eventually result in fatigue failures at these junctions. Such failures are an important cause of malfunction within measurement probes down-hole.

There are other applications in which electrical circuit boards mounted within tubes or otherwise are subjected to vibration in operation, and various measures have been proposed for protecting the circuitry against failure due to vibration. For example, U.S. Pat. Specification No. 4,072,378 proposes the injection into wiring cavities of a flexible foamed resin to protect the electronic components of apparatus for installation in a motor vehicle engie compartment. Furthermore U.S. Patent Specification No. 3,539,874 suggests mounting a cradle of an indicating instrument, for use in aircraft for example, by means of a locking arrangement and two resilient pads which engage the circular periphery of each circuit board. The resilient pads are capable of being compressed to enable the circuit boards to be engaged within the locking position. U.S. Patent Specification No. 2,832,012 discloses a magnetic amplifier structure in which a series of power stage reactors are mounted within a tube and are separated by means of layers of resilient rubber extending transversely of the tube and cushioning the reactors against mechanical vibration.

However, none of these prior arrangements would be suitable for protecting a measurement probe against device failure due to the mechanical vibration likely to be encountered down-hole.

It is an object of the invention to provide an assembly for supporting an electrical circuit within a tube which is suitable for use in such a measurement probe.

SUMMARY OF THE INVENTION

According to the present invention, there is provided an assembly for supporting an electrical circuit board within a tube, the assembly comprising the circuit board, an elongated support spine for extending longitudinally along the tube and supporting the circuit board, and shock-absorbing means for holding the assembly within the tube, wherein the circuit board is arranged parallel to a support surface of the spine with a gap therebetween, and a layer of vibration-absorbing material is interposed in the gap between the circuit board and the spine.

Such an arrangement provides a dual mechanism for isolating the circuit board to a substantial extent from mechanical vibration and shock. More particularly, the arrangement is especially suitable for protecting the circuitry against the effects of the particular vibration spectrum likely to be encountered in a down-hole environment.

Preferably the circuit board has two ends spaced apart longitudinally of the spine, and the vibration-absorbing layer extends continuously from one end to the other of the circuit board so as to support substantially the complete length of the circuit board.

Preferably the circuit board has two sides spaced apart transversely of the spine, and the vibration absorbing layer extends continuously from one side to the other of the circuit board so as to support substantially the complete width of the circuit board.

The vibration-absorbing layer is advantageously an elastomeric layer. Most advantageously the vibration-absorbing layer comprises a fillet of a thixotropic elastomer sealing one side of the gap between the circuit board and the spine, and a layer of a silicon elastomer filling a remaining part of the gap between the circuit board and the spine.

Furthermore the spine is conveniently substantially semicircular in section with a curved surface having an outer radius matching the inner radius of the tube within which the assembly is to be accommodated and a flat support surface for supporting the circuit board.

In a preferred arrangement, the assembly further includes support posts for acting between the circuit board and the inside wall of the tube on the opposite side of the circuit board to the support spine. The posts are conveniently spaced at equal intervals along the longitudinal axis of the spine. Furthermore, the support posts may be capped with rubber bumpers for engaging the inside wall of the tube.

BRIEF DESCRIPTION OF THE DRAWING

In order that the invention may be more fully understood, a preferred embodiment of the invention will now be descsribed, by way of example, with reference to the accompanying drawing, in which:

FIG. 1 is a cross-section of the assembly within a tube; and

FIG. 2 is a longitudinal section, on a smaller scale, through part of the assembly and tube.

DETAILED DESCRIPTION OF THE DRAWING

Referring to the drawing, the illustrated assembly comprises several electrical circuit boards 1, of which only one is shown in the drawing, an aluminium support spine 2 of semicircular section, and a layer 3 of vibration-absorbing material intermediate the circuit boards 1 and the spine 2. Each of the boards 1 is a conventional printed circuit board on which are mounted a number of electrical components 4. For ease of fabrication the layer 3 comprises a fillet 5 of a thixotropic elastomer, and a layer 6 of a silicon elastomer of 40 durometer hardness, such as an RTV type material. During fabrication of the assembly, the board 1 and spine 2 are maintained the required distance apart, and the fillet 5 is formed by applying the thixotropic elastomer to the assembly to seal one side of the gap between the board 1 and spine 2. The material of the fillet 5 sets rapidly, and serves to close off the gap on one side whilst free-flowing silicon elastomer is introduced to fill the remainder of the gap and sets to form the completed layer 3.

The assembly additionally includes a number of aluminium posts 7 capped with rubber bumpers 8. The posts 7 are disposed at regular intervals along the length of each board 1. Additionally, in order to hold the assembly within the tube 9, the arrangement includes two rubber tubular members 10 disposed in grooves 11 in the spine 2 parallel to, and symmetrically disposed with respect to, a plane 12 (shown by a broken line in FIG. 1) perpendicular to the board 1 and passing through the central longitudinal axis of the board 1.

In a first insertion method, the assembly is introduced into the tube 9, and, after positioning the assembly as required within the tube 9, air pressure is applied to the tubular members 10 to cause the tubular members 10 to expand and lock the assembly within the tube 9. The applied pressure can be maintained within the tubular members 10 by closing off the ends of the members.

In an alternative insertion method, the tubular members 10 are normally of sufficient size and sufficiently incompressible to prevent the assembly from being inserted within the tube 9. To enable insertion the tubular memers 10 are evacuated so as to contract the tubular members and enable the assembly to be inserted into the correct position within the tube 9. Subsequently the vacuum is released so that the tubular members 10 assume their previous states and serve to lock the assembly firmly within the tube 9.

The above described arrangement is particularly advantageous as it renders the circuit boards substantially resistant to failure due to mechanical vibration and shock down-hole. More particularly the arrangement is capable of withstanding high vibration levels up to a frequency of the order of 1 KHz, due to the fact that the maximum strains between the components and the boards are kept within levels which should ensure freedeom from fatigue failures. The layer 3 provides a continuous elastic foundation for supporting the bords which has the effect of rendering the lowest mode natural frequency of each board very substantially above 1 KHz. The complete assembly is resiliently supported within the tube 9 by the tubular members 10 which run the complete length of the spine 2 and by the intermittently spaced posts 7 whose rubber caps 8 serve as the third stabilising leg of the support system. The tubular members 10 reliably maintain separation between the metal spine 2 and the metal wall of the tube 9, and provide resistance to shock.

Various modifications can be made to the above described arrangement without departing from the scope of the invention. For example the two tubular members 10 may be replaced by a single tubular member accommodated within a single groove in the spine 2 at the position where the plane 12 meets the outer periphery of the spine 2. Also, instead of the boards being supported by a continuous layer of elastomeric material, each bord may be supported only by a fillet at each of its four edges, although it will be appreciated that such an arrangement will not be as efficient in increasing the minimum natural frequency of the boards. Moreover the vibration-absorbing layer 6 may have a hardness in the range of 30 to 70 durometers.

We claim:

1. An assembly for supporting an electrical circuit baord within a tube having an inside surface, the assembly comprising the circuit board, an elongated support spine for extending longitudinally along the tube and supporting the circuit board, and shock-absorbing means for holding the assembly within the tube, the spine having a holding surface arranged adjacent the inside surface of the tube and a support surface spaced from the inside surface of the tube, the circuit board having a base surface parallel to the support surface of the spine with a gap therebetween, and a layer of vibration-absorbing material being interposed in the gap between the circuit board and the spine.

2. An assembly accordingly to claim 1, wherein the circuit board has two ends spaced apart longitudinally of the spine, and the vibration-absorbing layer extends continuously from one end to the other of the circuit board so as to support substantially the complete length of the circuit board.

3. An assembly according to claim 1, wherein the circuit board has two sides spaced apart transversely of the spine, and the vibration absorbing layer extends continuously from one side to the other of the circuit board so as to support substantially the complete width of the circuit board.

4. An assembly according to claim 1, wherein the vibration-absorbing layer is an elastomeric layer.

5. An assembly according to claim 1, wherein the vibration-absorbing layer comprising a fillet of a thixotropic elastomer sealing one side of the gap between the circuit board and the spine, and a layer of a silicon elastomer filling a remaining part of the gap between the circuit board and the spine.

6. An assembly according to claim 1, wherein the spine is substantially semicircular in section, the holding surface being a curved surface having an outer radius matching the radius of the inside surface of the tube within which the assembly is to be accommodated, and the support surface being a flat surface.

7. An assembly according to claim 1, which further includes support posts for acting between the circuit board and the inside wall of the tube on the opposite side of the circuit board to the support spine.

8. An assembly according to claim 7, wherein the support posts are spaced at equal intervals along the longitudinal axis of the spine.

9. An assembly according to claim 7, wherein the support posts are capped with rubber bumpers for engaging the inside wall of the tube.

* * * * *